US006686214B2

(12) United States Patent
Antaki et al.

(10) Patent No.: US 6,686,214 B2
(45) Date of Patent: Feb. 3, 2004

(54) METHOD OF ALIGNING A PHOTOLITHOGRAPHIC MASK TO A CRYSTAL PLANE

(75) Inventors: Robert Antaki, St. Luc (CA); Riopel Yan, Bromont (CA); Annie Vachon, Granby (CA)

(73) Assignee: Dalsa Semiconductor Inc., Waterloo (CA)

( * ) Notice: Subject to any disclaimer, the term of this patent is extended or adjusted under 35 U.S.C. 154(b) by 25 days.

(21) Appl. No.: 09/799,494

(22) Filed: Mar. 7, 2001

(65) Prior Publication Data

US 2002/0072193 A1 Jun. 13, 2002

(30) Foreign Application Priority Data

Dec. 8, 2000  (GB) ............................................. 0029929

(51) Int. Cl.[7] .......................... H01L 21/66; H01L 21/76; H01L 21/302; H01L 21/461; G01R 31/26
(52) U.S. Cl. .......................... 438/16; 438/401; 438/753
(58) Field of Search ................................. 438/401, 753, 438/16; 257/797

(56) References Cited

U.S. PATENT DOCUMENTS

| 4,309,813 | A | | 1/1982 | Hull ............................. 29/580 |
| 4,470,875 | A | | 9/1984 | Poteat ......................... 156/644 |
| 5,830,605 | A | | 11/1998 | Umeki et al. ................... 430/5 |
| 6,066,513 | A | * | 5/2000 | Pogge et al. ................. 438/113 |

FOREIGN PATENT DOCUMENTS

EP          0 335 074 A2     1/1989

OTHER PUBLICATIONS

Precise mask alignment to the crystallographic orientation of silicon wafers using wet anisotropic etching—Mattias Vangbo and Yiva Backlund.

Precise Mask alignment Design to Crystal Orientation of (100) Silicon Wafer Using Wet Anisotropic Etching—Ping-Hei Chen, Chia–Ming Hsieih, Hsin–Yah Peng, Minking K. Chyu.

"Precision alignment of mask etching with respect to crystal orientation", J.M. Lai et al., pp. 327–329.

"Alignment of mask patterns to crystal orientation", G. Ensell, pp. 345–348.

* cited by examiner

Primary Examiner—Olik Chaudhuri
Assistant Examiner—William M. Brewster
(74) Attorney, Agent, or Firm—Marks & Clerk

(57) ABSTRACT

In order to align a mask to a specific crystal plane in a wafer, a first mask having at least one alignment structure is deposited on the wafer surface. The alignment structure is coarsely aligned with the specific crystal plane and has an array of components that are offset relative to each other by known angles defining the degree of precision with which said mask can be finely aligned with said crystal plane. Next, an anisotropic etch is performed through the first mask to etch the alignment structure into the wafer surface. The components of the alignment structure produce different etch patterns in the wafer surface according to their relative orientation to the specific crystal plane. Finally, a second mask is formed on the wafer surface having a reference structure thereon. The reference structure on the second mask is aligned relative to an etch pattern identified as being finely aligned with the specific crystal plane.

10 Claims, 5 Drawing Sheets

METHOD OF ALIGNING A PHOTOLITHOGRAPHIC MASK TO A CRYSTAL PLANE

BACKGROUND OF THE INVENTION

1. Field of the Invention

This invention relates to the fabrication of semiconductor devices, and in particular to a method of aligning a photo-lithographic mask to a crystal plane.

2. Description of the Prior Art

In the fabrication of semiconductor devices, there are many applications where it is important to be able to precisely align a photo-lithographic mask to the crystal planes of a silicon wafer. Various techniques have been proposed for achieving this result.

In one technique the major and/or the minor flat of the silicon wafer is used to perform the crystal plane alignment. This technique limits the precision of the alignment of the crystal plane of the wafer and the repeatability of the alignment from wafer to wafer because the manufacturers of such silicon wafers do not specify the orientation of these major and/or minor flats to better than about ±1°. Moreover, the mechanical alignment to the major and/or minor flat of the wafer results in even more imprecision in the alignment of that wafer and even more non-repeatability in the alignment from wafer-to-wafer. This alignment technique is widely used by most semiconductor device manufacturers.

An alternative technique is to use X-ray equipment to find the crystal plane of the silicon wafer. In this case, the X-ray equipment would need to be integrated into the photoresist exposure equipment so as to allow a precise location of the crystal plane and a simultaneous alignment of the photo-lithographic mask to the crystal plane in order to perform the transfer of the photo-lithographic pattern onto the silicon wafer.

The article "Precise mask alignment to the crystallographic orientation of silicon wafers using wet anisotropic etching", M. Vangbo and Y Backlund, J. Micromech, Microeng, 6 (1996), pp. 279–284 describes a technique using fork structures to align the mask.

The use of a technique involving circular structures is described in the article "Precise mask alignment design to crystal orientation of (100) silicon wafer using wet anisotropic etching", P.-H. Chen, C.-M. Hsieh, H.-Y. Peng and M.-K. Chyu, Proceedings of SPIE Vol. 4174 (2000), pp. 462–466.

The above techniques are either insufficiently precise or else not suitable for a high-throughput production process.

SUMMARY OF THE INVENTION

According to the present invention there is provided a method of aligning a mask to a specific crystal plane in a wafer, comprising the steps of forming a first mask having at least one alignment structure on a wafer surface, said alignment structure being coarsely aligned with said specific crystal plane and having an array of components that are offset relative to each other by known angles defining the degree of precision with which said mask can be finely aligned with said crystal plane; performing an anisotropic etch through said first mask to etch said alignment structure into said wafer surface, said components of said alignment structure producing different etch patterns in said wafer surface according to their relative orientation to said specific crystal plane; forming a second mask on said wafer surface having a reference structure thereon; and aligning said reference structure on said second mask relative to a said etch pattern identified as being finely aligned with said specific crystal plane.

In accordance with the principles of the invention, a first mask is used to determined the orientation of the desired crystal plane. A second mask can then be used to form index marks in the wafer by aligning the second mask with the etch patterns formed by the first mask that are finely aligned with the desired crystal plane. These index marks can then be used to align subsequent masks used to fabricate functional components in the wafer. If desired, it is possible to form functional patterns on the second mask in addition to the alignment marks.

The above method lends itself to automatic pattern recognition, which is the preferred technique for aligning the second mask with the etch patterns produced by the first mask.

Typically, the aligned patterns are those with symmetrical structures due to the effects of the anisotropic etch on the different crystal planes.

The first mask may contain different types of alignment structure to improve accuracy. In a preferred embodiment, the first mask contains triplet, fork and square structures, which are aligned relative to each other. Other structures that allow quick and easy observation of line shape deformation and asymmetry or that allow independent mask alignment onto patterns with little shape deformation and asymmetry from a wet etch from a wet etch can be employed.

Typically, in the case of silicon a wet etch chemistry that can etch silicon wafer at high rate at particular crystal plane orientations and at lower rate at other particular crystal plane orientations is employed.

The second photo-lithography mask may also contain other structures that allow alignment onto the patterns of the first photo-lithography mask that resulted in little shape deformation and asymmetry from a wet etch.

A pattern recognition device can integrated to apparatus capable of pattern transfer onto the silicon wafer. This can allow an automatic alignment of the second photo-lithography mask onto the structures of the first photo-lithography mask that resulted in little shape deformation and asymmetry from a wet etch;

The present invention makes it possible to achieve a low cost and high throughput alignment between the photo-lithographic masks and the crystal planes of the silicon wafer better than ±0.1°.

BRIEF DESCRIPTION OF THE DRAWINGS

The invention will now be described in more detail, by way of example only, with reference to the accompanying drawings, in which.

DETAILED DESCRIPTION OF A PREFERRED EMBODIMENT

In a first step, a first photo-lithographic mask containing three structures is transferred with a Canon MPA-600-FA projection aligner onto a {100} orientation surface of an N-type 150 mm diameter silicon wafer using its major flat to achieve coarse alignment to its crystal planes. The major flat allows the alignment of this first photo-lithographic mask to the crystal plane of the silicon wafer with a precision better than about ±1° since the manufacturer of this silicon wafer (Wacker-Siltronics) guarantees an alignment of the crystal plane and of the major flat to less ±1°.

Figure 1:
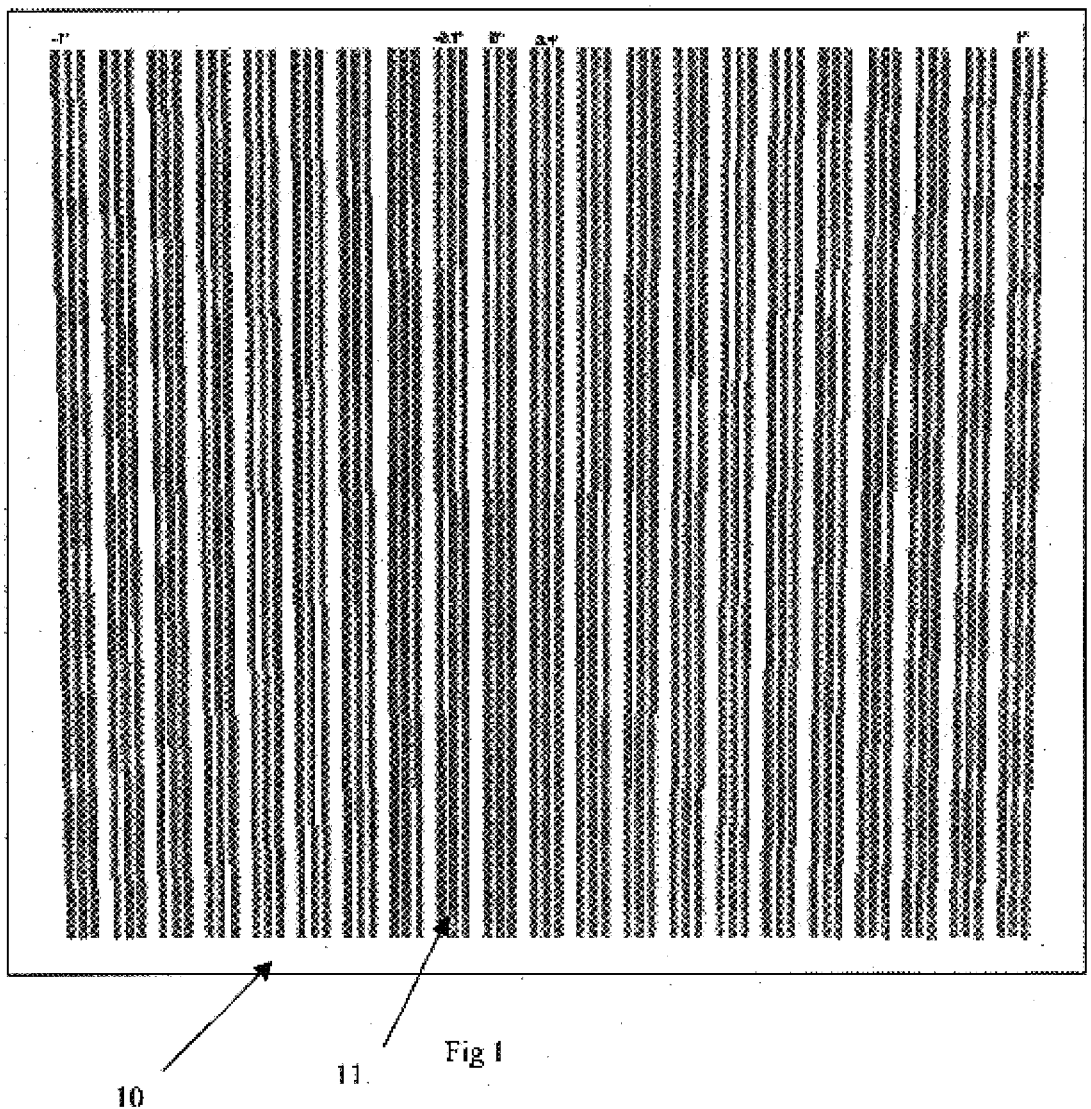
FIG. 1 is plan view of a triplet alignment structure.

The first mask contains three separate alignment structures formed on the mask. The first structure 10 is shown in FIG. 1 and consists in triplets 11 of long (430 µm), narrow (3 µm) and closely spaced (3 µm) lines. Each triplet 11 of lines is separated from each other (8 µm) and and tilted by 0.1° with respect to its next neighboring triplet. The orientation of the various triplets covers the full ±1° range. Thus, a series of twenty one triplets extending from −1° to +1° is required to fully cover the misalignment of a silicon wafer supplied from a manufacturer that guarantees ±1° alignment of the major and/or minor flat, a series of forty-one triplets extending from −2° to +2° is required for a silicon wafer from a manufacturer that guarantees ±2° alignment, and a series of sixty-one triplets extending from −3° to +3° is required for a ±3° specification and so on. The central triplet of this first structure of this first photo-lithographic mask is positioned perpendicular to the major flat using the standard positioning sequence of the Canon MPA-600-FA projection aligner. A better resolution aligner could allow the use of narrower and more closely spaced lines and triplets.

Figure 2:
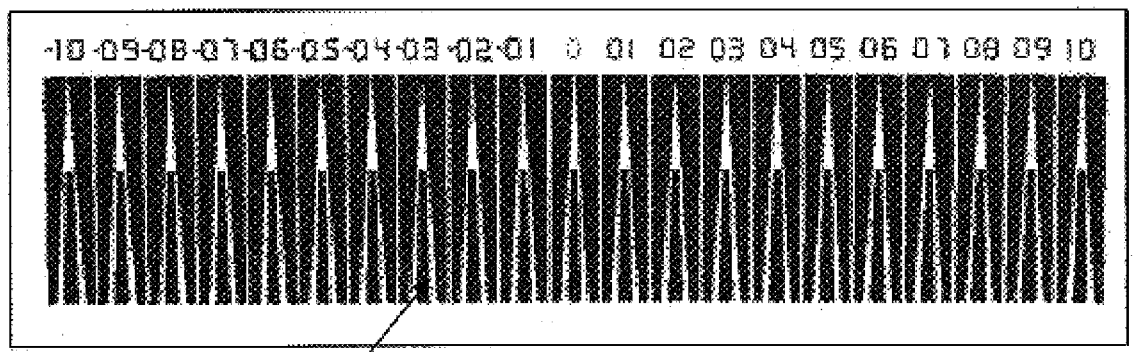
FIG. 2 is a plan view of a fork alignment structure.

The second structure of this first photo-lithographic mask is shown in FIG. 2 and consists of the alignment forks 20 as described in the Vangbo and Backlund paper referred to above. Each fork 20 (125 µm wide, 450 µm long, alpha=1.0, beta=3.5) is tilted by 0.1° with respect to its neighboring fork as to cover the full ±1° range. As was the case with the linear triplet structures, twenty-one forks are required to cover −1° to +1°; forty-one forks to cover a full ±2° range; sixty-one forks to cover −3° to +3°; and so on. The central fork of this second structure of this is also positioned perpendicular to the major flat using the standard positioning sequence of the Canon MPA-600-FA projection aligner. Since this second structure is on the same mask as the first structure, any mechanical misalignment of the triplets of the first structure will be reproduced by an equivalent mechanical misalignment on the corresponding forks of the second structure.

Figure 3:
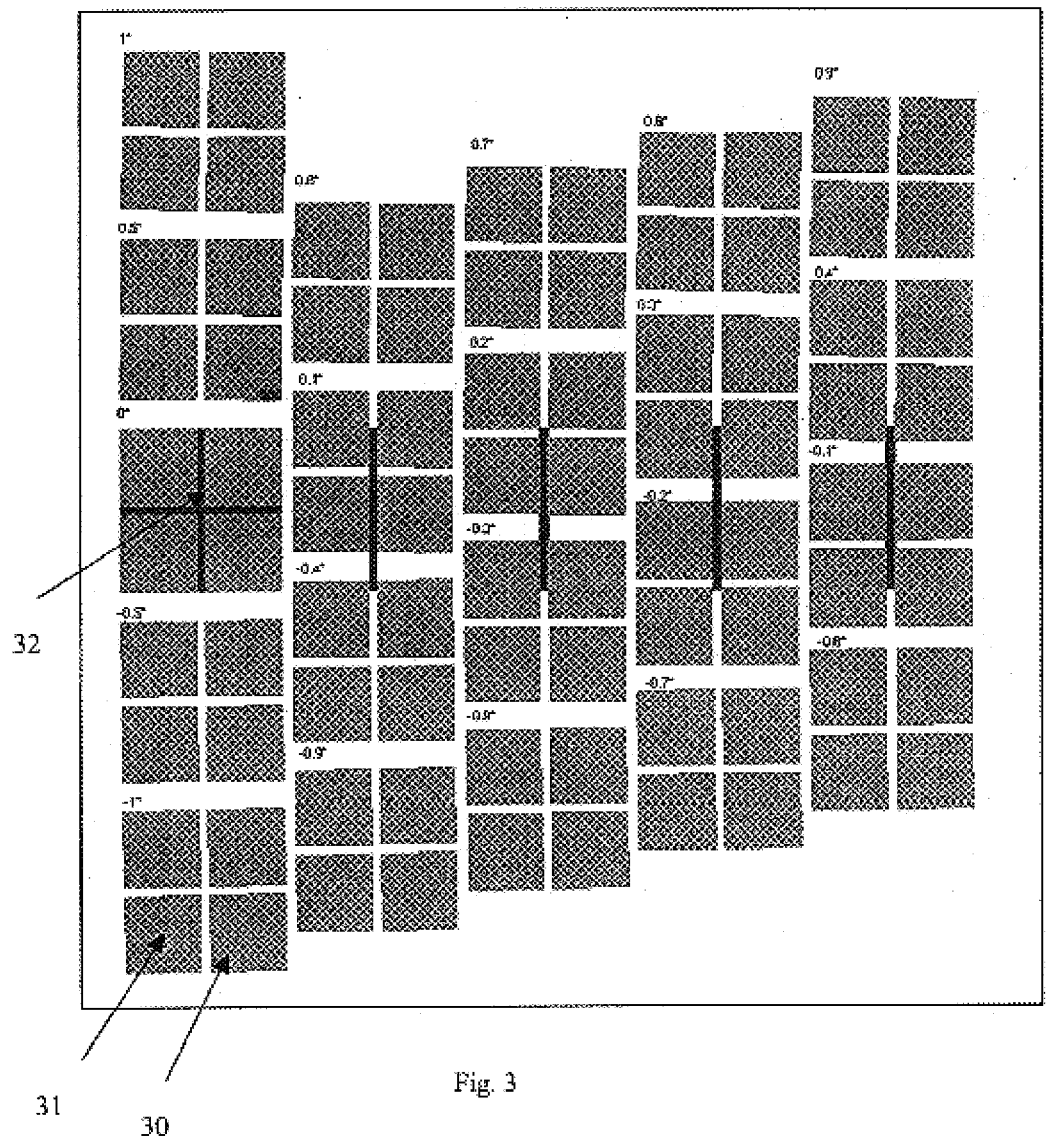
FIG. 3 is a plan view of an alignment structure consisting of squares.

The third structure on the first structure 30, hereafter called quartet, of this first photo-lithographic mask is shown in FIG. 3 and consists of four small squares 31 (160 µm by 160 µm as to provide a total area of 344 µm by 344 µm) closely spaced (24 µm spacing) as to generate a single symmetrical cross between them. Again, each quartet is separated from its neighbor by (70 µm) and is tilted by 0.1° with respect to its neighboring quartet as to cover the full ±1° range. Twenty-one such quartets are positioned in a matrix of four times five quartets (positioned on 5 circular arcs) plus one isolated structure (at the end of one circular arc) extending from −1° to +1°. As before, forty-one quartets are required to cover the range from −2° to +2°, and sixty-one quartets are required to cover the range from −3° to +3° and so on.

The central quartet of this third alignment structure is also positioned perpendicular to the major flat using the standard positioning sequence of the Canon MPA-600-FA projection aligner. Again, since this third structure is on the same mask as the second structure which is on the same mask as the first structure, any mechanical misalignment of the triplets of the first structure will be reproduced by an equivalent mechanical misalignment on the corresponding forks of the second structure and will be reproduced by an equivalent mechanical misalignment on the corresponding quartets of the third structure. Using three structures on the same mask provides a better resolution aligner and allows a mask manufacturer to use smaller and more closely spaced squares and a different positioning matrix.

After deposition of the first mask containing the structures discussed above, an anisotropic wet etch is performed in a Tetra-Methyl-Ammonium-Hydroxide (TMAH) solution in water (25% TMAH in water) at 90° C. for 30 minutes on a static wafer. TMAH provides different etch rates for the various crystal plane orientations of the silicon wafer:

The obtained etch rate perpendicular to the {100} plane orientation (perpendicular to the plane of the wafer) is about 0.667 µm/min (20 µm in 30 minutes), whereas the obtained etch rate perpendicular to the {111} orientation (tilted by 54° with respect to the plane of the wafer and parallel to the direction of the major flat) is about 0.0133 µm/min (0.4 µm in 30 minutes).

As the silicon is etched in such an orientation-selective-wet-etcher, the very different etch rates associated to the different crystal plane orientations cause significant modifications to the shape of the transferred structures and after a while the triplets, forks and quartets not perfectly aligned with the crystal plane will lose their symmetrical shape and will become easily distinguishable from each other. This loss of symmetry is discussed by the cited prior art.

Figure 4:
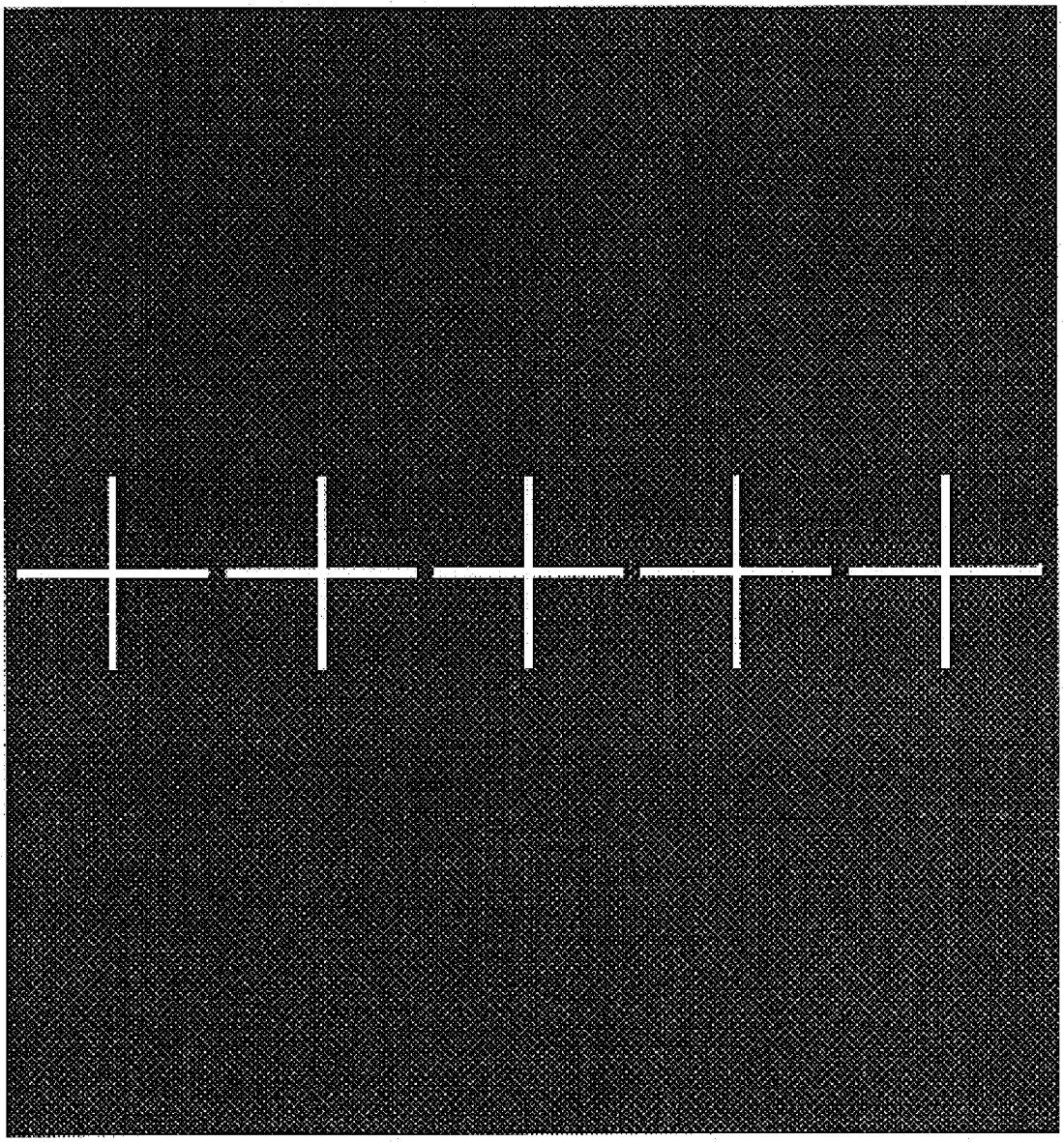
FIG. 4 shows the alignment structure on the second mask.

The first mask is then stripped from the wafer and a second photo-lithographic mask applied with the aid of a Canon MPA-600-FA projection aligner. The second mask is shown in FIG. 4 and carries alignment crosses 32.

The Canon projection aligner is used to align the symmetrical cross 32 (20 µm wide) to the etch pattern, derived from a quartet 30 (so 2 µm each side for alignment), fork 20 or triplet 11 from the alignment structures that show a symmetrical etch and therefore correspond to an orientation aligned with the desired crystal plane. The symmetrical patterns can be readily identified, either visually or preferably with an automatic pattern recognition device.

The second photo-lithographic mask is also used to etch alignment indicia, such as chevrons, into the wafer surface and which can then be used to align subsequent processing masks to the wafer with the desired degree of precision. These can be formed by a wet etch or any other etch process since anisotropy is not essential for this step.

Figure 5:
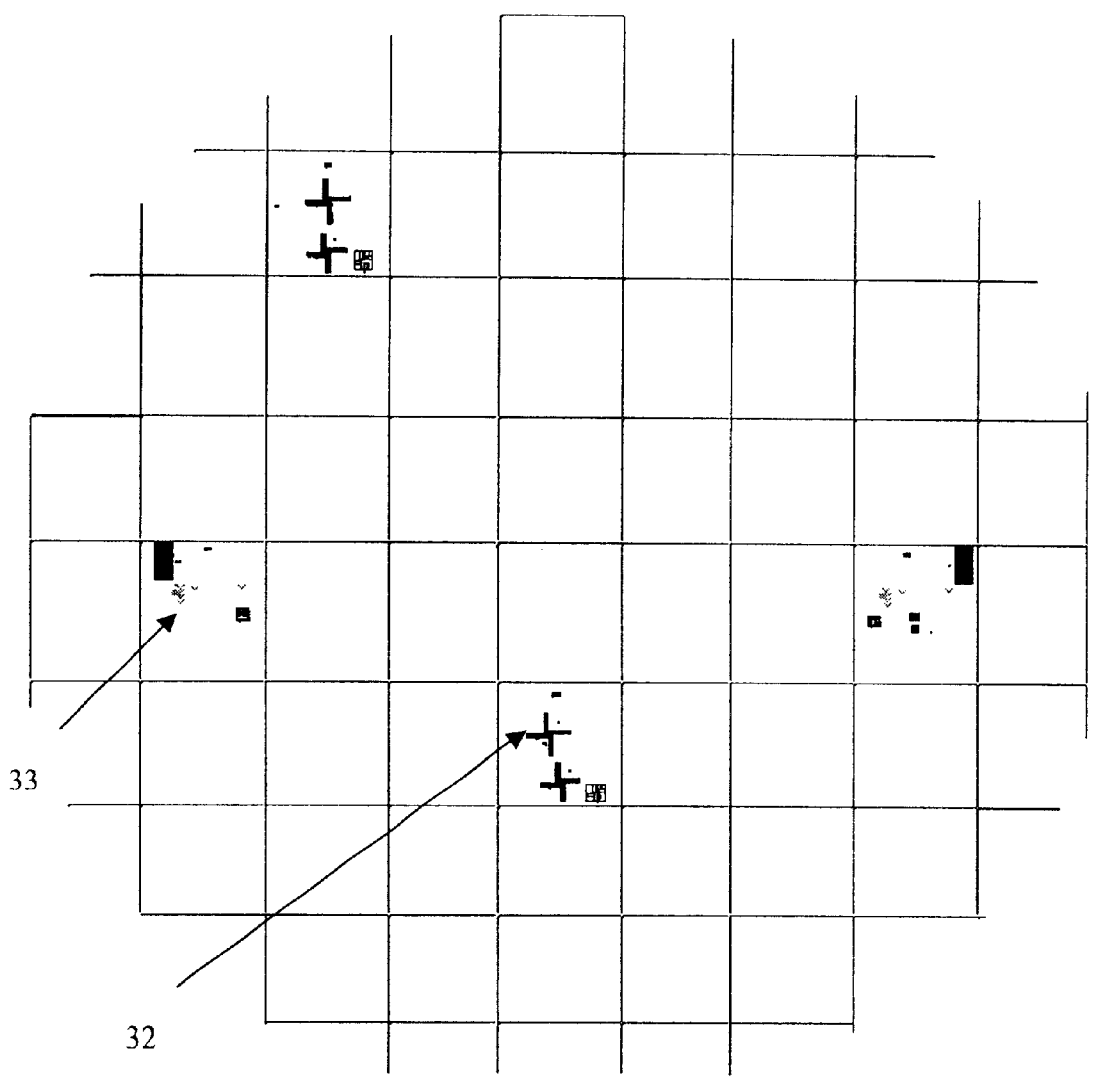
FIG. 5 shows a full mask layout with alignment marks and dicing scribelines.
Figure 6:
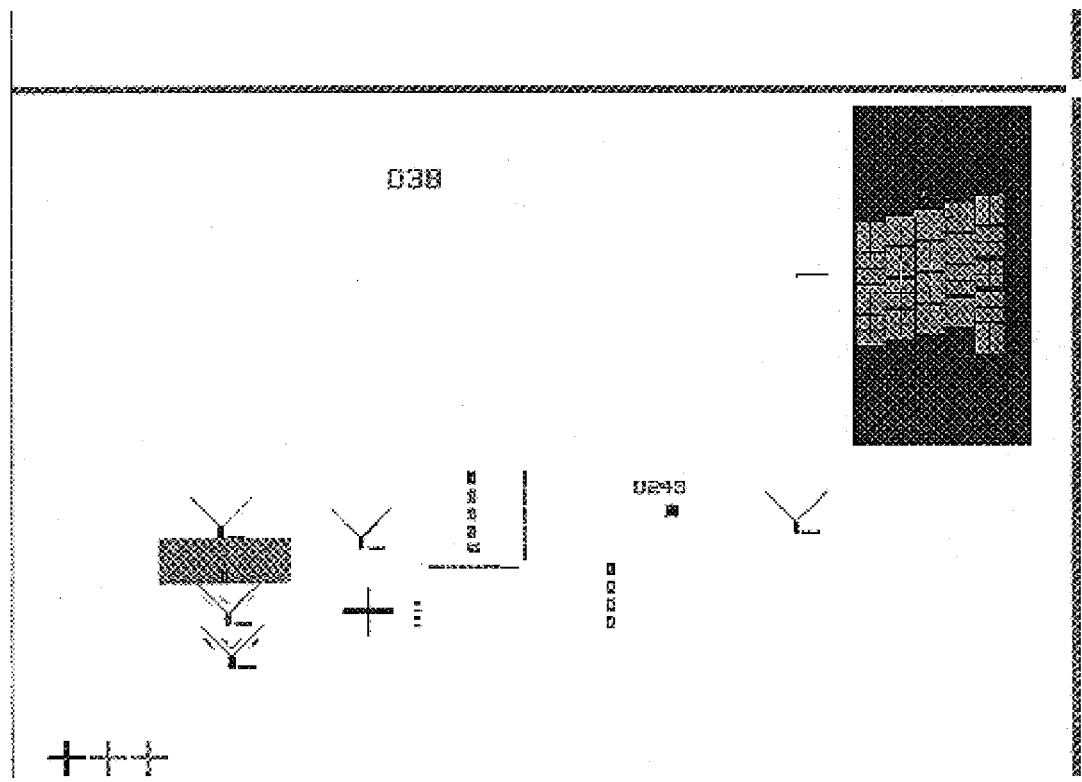
FIG. 6 shows a die layout showing the chevrons and crosses.

The complete second mask is shown in more detail in FIG. 5, which shows the alignment crosses 32 and chevrons 33 used as index marks for subsequent masks. FIG. 6 shows the die layout after etching with the second mask.

This method makes it possible to achieve a high throughput and a low cost mask alignment to crystal planes for the subsequent masks with the required ±0.1° precision and repeatability.

Many variations to the above described embodiment are possible. For example, the photo-lithographic mask containing the alignment structures could be transferred with another type of aligner, such as 1:1 projection aligner, by a stepper or other of aligner that has the necessary resolution.

The second mask could contain other alignment indicia other than the chevrons. Those alignment indicia should be the appropriate for the machine used for mask alignment.

The orientation, doping type, size and flat locations of the silicon wafer could be different from the preferred {100} orientation N-type 150 mm diameter silicon wafer using its major flat as "coarse" alignment to its crystal planes. The silicon wafer could be specified with a poorer or a tighter crystal plane orientation than the preferred ±1°.

The first alignment structure consisting of triplets could use longer or shorter lines than the preferred 430 µm, wider or narrower lines than the preferred 3 µm, and more or less closely spaced line than the preferred 3 µm. The triplets could be more or less closely spaced than the preferred 8 µm.

The second structure using forks could use longer or shorter forks than the preferred 450 µm, wider or narrower forks than the preferred 125 µm, alpha values higher or lower than the preferred 1.0 and beta values higher or lower than the preferred 3.5. The forks themselves could be arranged differently than the preferred linear arrangement. Also, circles as discussed in the Chen prior art or another type of crystal alignment structure could be employed.

The third structure using quartets could use larger or smaller squares than the preferred 160 µm and wider or narrower spacing between squares than the preferred 24 µm. The quartets of squares could be more or less separated from each other than the preferred 70 µm. The distribution of the quartets could be different than the preferred matrix of four by five structures (positioned on 5 circular arcs) plus one isolated structure.

An offset angle larger or smaller than the preferred 0.1° could be used between next neighboring triplets, forks or square quartets as to reduce or improve the alignment resolution between neighboring individuals. The number of individuals would then be reduced or increased as compared to the preferred number 21 as to cover the preferred −1° to +1° range.

The preferred −1° to +1° range can be increased or decreased as to cover a looser or tighter specification for the silicon wafer crystal plane alignment to the flats.

The alignment structures themselves could be different from the proposed triplets, forks or square quartets. The chosen structure should have an asymmetry easy to inspect after an anisotropic wet etch and have at least one symmetrical structure easy to align with a second mask structure in an automated mode using a pattern recognition device.

The concentration of the Tetra-Methyl-Ammonium-Hydroxide (TMAH) solution in water could be higher or lower than the preferred 25% TMAH in water. The temperature of the Tetra-Methyl-Ammonium-Hydroxide (TMAH) solution could be different than the preferred 90° C.

The wet etch depth could be deeper or shallower than the preferred 20 µm and should be optimized for coarser or finer structures.

The wet etch solution could be different from the preferred Tetra-Methyl-Ammonium-Hydroxide (TMAH) solution so as to provide various etch rates for the various crystal plane orientations of the silicon wafer. Alternate solutions include Potassium Hydroxide (KOH), Sodium Hydroxide (NaOH), Ammonium Hydroxide ($NH_4OH$), Hydrazine, Ethylene Diamine Pyrocatechol (EDP), Tetra Methyl Ammonium Hydroxide (TMAH) et all quaternary ammonium hydroxides such as Tetra Ethyl Ammonium Hydroxide (TEAH) and Tetra Propyl Ammonium Hydroxide (TPAH). All strong caustic or basic etching solutions behave in the same fashion and can serve as an alternative.

The second photo-lithographic mask could use wider or narrower quartet than the preferred 20 µm and could use wider or narrower overlap than the preferred 2 µm.

The second photo-lithographic mask could use alternate alignment structures than the preferred symmetrical crosses as long as other conventional alignment marks can be simultaneously dropped using the same photo-lithographic mask.

The element of the single crystal substrate itself could be different from the preferred silicon. In fact, other elements such as germanium, Ge, and other compounds such as gallium arsenide, GaAs or indium phosphide, InP, could be used if a wet etch of that different substrate can result in the required orientation specific etch rates.

The invention finds application in photonics devices, such as optical switches based on rotating or vibrating mirrors. Micro Electro Mechanical Systems (MEMS) for various applications could use this invention as to perform mask alignment.

The invention thus provides an alignment strategy for a photo-lithographic mask that allows a low cost and high throughput to the crystal planes of a silicon wafer with a precision of about ±0.1°.

What is claimed is:

1. A method of aligning a mask to a specific crystal plane in a wafer, comprising the steps of:

forming a first mask having at least one alignment structure on a wafer surface, said alignment structure being coarsely aligned with said specific crystal plane and having an array of components that are offset relative to each other by known angles defining the degree of precision with which said mask can be finely aligned with said crystal plane;

performing an orientation-selective anisotropic etch through said first mask to etch said alignment structure into said wafer surface, said components of said alignment structure producing different etch patterns in said wafer surface according to their relative orientation to said specific crystal plane, said etch patterns being aligned with said crystal plane having a symmetrical shape;

stripping said first mask from said wafer;

providing a second mask, different from said first mask, bearing alignment patterns and an index structure, said index structure being distinct from said alignment patterns;

orienting said second mask so that said alignment patterns are aligned with said etch patterns having a symmetrical shape;

applying said second mask to said wafer surface; and performing a second etch through said second mask to etch said index structure into said wafer for use in crystal plane alignment during subsequent wafer processing, said index structure being aligned with said specific crystal plane to a precision greater than ±1°.

2. A method as claimed in claim 1, wherein said index structure comprises chevron marks.

3. A method as claimed in claim 1, wherein said second mask is aligned with said reference etch pattern using pattern recognition equipment.

4. A method as claimed in claim 1, wherein said first mask includes a plurality of different alignment structures.

5. A method as claimed in claim 4, wherein said alignment structures are selected from the group consisting of forks, liner triplets and quartets.

6. A method as claimed in claim 1, wherein said etch is a wet etch.

7. A method as claimed in claim 6, wherein said wet etch is performed with Tetra-Methyl-Ammonium-Hydroxide.

8. A method as claimed in claim 1, further comprising depositing subsequent masks for etching functional patterns into said wafer surface, each said subsequent mask being aligned with said index structure etched into the wafer.

9. A method as claimed in claim 1, wherein said alignment patterns are crosses.

10. A method as claimed in claim 9, wherein said index patterns are aligned with said symmetrical etch patterns with a projection aligner.

* * * * *